(12) United States Patent
Soucy et al.

(10) Patent No.: US 6,578,893 B2
(45) Date of Patent: Jun. 17, 2003

(54) APPARATUS AND METHODS FOR HANDLING SEMICONDUCTOR WAFERS

(75) Inventors: Alan J. Soucy, Georgetown, MA (US); James S. Castantini, Newburyport, MA (US)

(73) Assignee: AJS Automation, Inc., Ipswich, MA (US)

( * ) Notice: Subject to any disclaimer, the term of this patent is extended or adjusted under 35 U.S.C. 154(b) by 0 days.

(21) Appl. No.: 09/968,364

(22) Filed: Oct. 1, 2001

(65) Prior Publication Data

US 2002/0079714 A1 Jun. 27, 2002

Related U.S. Application Data

(60) Provisional application No. 60/237,251, filed on Oct. 2, 2000.

(51) Int. Cl.$^7$ ................................................. B25J 15/12
(52) U.S. Cl. ......................... 294/99.1; 414/941; 901/31
(58) Field of Search ............................... 294/99.1, 99.2, 294/103.1, 33, 907; 414/935–941; 901/32–34, 36, 39, 46

(56) References Cited

U.S. PATENT DOCUMENTS

| | | | |
|---|---|---|---|
| 4,449,885 A | | 5/1984 | Hertel et al. |
| 4,453,757 A | * | 6/1984 | Soraoka ........................ 269/233 |
| 4,540,034 A | | 9/1985 | Young |
| 4,542,426 A | | 9/1985 | Wilkinson, Jr. et al. |
| 4,553,069 A | | 11/1985 | Purser |
| 4,610,475 A | * | 9/1986 | Heiserman ................... 294/86.4 |
| 4,681,213 A | | 7/1987 | Winiasz |
| 4,715,637 A | * | 12/1987 | Hosoda et al. ............... 294/106 |
| 4,752,180 A | | 6/1988 | Yoshikawa |
| 4,773,687 A | | 9/1988 | Bush et al. |
| 4,823,654 A | | 4/1989 | Moore |
| 4,839,947 A | | 6/1989 | Cohen et al. |
| 4,858,980 A | * | 8/1989 | Dreisig et al. ................ 24/545 |
| 5,001,594 A | | 3/1991 | Bobbio |
| 5,046,909 A | | 9/1991 | Murdoch |
| 5,054,834 A | | 10/1991 | Alessandri et al. |
| 5,121,908 A | | 6/1992 | Shatkus et al. |
| 5,240,753 A | | 8/1993 | Tabuchi et al. |
| 5,547,515 A | | 8/1996 | Kudo et al. |
| 5,555,634 A | | 9/1996 | Uchiyama et al. |
| 5,647,626 A | | 7/1997 | Chen et al. |
| 5,692,873 A | | 12/1997 | Weeks et al. |
| 5,699,211 A | | 12/1997 | Magnusson et al. |
| 5,700,046 A | * | 12/1997 | Van Doren et al. ......... 294/119.1 |
| 5,746,460 A | | 5/1998 | Marohl et al. |
| 5,765,890 A | | 6/1998 | Gaylord et al. |
| 5,787,561 A | | 8/1998 | Harmand |
| 5,807,062 A | | 9/1998 | Schultz et al. |
| 5,836,575 A | | 11/1998 | Robinson et al. |
| 5,934,865 A | * | 8/1999 | Meadows ..................... 294/93 |
| 5,955,858 A | | 9/1999 | Kroeker et al. |
| 5,984,391 A | | 11/1999 | Vanderpot et al. |
| 6,036,426 A | | 3/2000 | Hillman |
| 6,053,688 A | | 4/2000 | Cheng |
| 6,075,334 A | | 6/2000 | Sagues et al. |
| 6,077,026 A | | 6/2000 | Shultz |
| 6,086,976 A | | 7/2000 | Gardner et al. |
| 6,089,748 A | | 7/2000 | McDermott et al. |

(List continued on next page.)

FOREIGN PATENT DOCUMENTS

JP          3-8611    *  1/1991    ................. 414/941

*Primary Examiner*—Dean J. Kramer
(74) *Attorney, Agent, or Firm*—Testa, Hurwitz & Thibeault, LLP (57) ABSTRACT

Disclosed are apparatus and methods used for handling semiconductor wafers or similar articles. In particular, the apparatus disclosed is capable of flexibly gripping items of various shapes and sizes in a manner that substantially reduces or eliminates the likelihood of damage thereto. The apparatus is particularly suited to being used as a robotic end effector for handling wafers using edge-gripping techniques.

12 Claims, 7 Drawing Sheets

U.S. PATENT DOCUMENTS

| | | |
|---|---|---|
| 6,112,735 A | 9/2000 | Farnworth |
| 6,116,848 A | 9/2000 | Thomas et al. |
| 6,120,360 A | 9/2000 | Ball et al. |
| 6,123,502 A | 9/2000 | Adams et al. |
| 6,158,941 A | 12/2000 | Muka et al. |
| 6,174,011 B1 * | 1/2001 | Keigler ..................... 294/1.1 |
| 6,231,297 B1 | 5/2001 | Hofmeister |
| 6,257,827 B1 | 7/2001 | Hendrickson et al. |
| 6,261,048 B1 | 7/2001 | Muka |
| 6,299,404 B1 | 10/2001 | Muka et al. |
| 6,364,592 B1 | 4/2002 | Hofmeister |

* cited by examiner

FIG. 4

APPARATUS AND METHODS FOR HANDLING SEMICONDUCTOR WAFERS

CROSS-REFERENCE TO RELATED APPLICATIONS

This application incorporates by reference, and claims priority to and the benefit of, U.S. Provisional Patent Application serial No. 60/237,251, which was filed on Oct. 2, 2000.

TECHNICAL FIELD

The present invention relates generally to apparatus and methods for handling semiconductor wafers or similar articles. More particularly, the present invention relates to a robotic end effector for handling semiconductor wafers using edge-gripping techniques.

BACKGROUND INFORMATION

Semiconductor manufacturing requires an ultra-clean environment for the silicon wafers during the manufacturing process; therefore it is highly desirable to have few moving parts in the wafer processing environment due to the risk of wear particles and the like migrating to the wafer surface, thereby contaminating the wafer and resulting in reduced production yields. Currently, the handling of semiconductor wafers and similar articles is accomplished using complex mechanical systems that require many moving parts.

Various examples of devices for handling wafers can be found in U.S. Pat. Nos. 4,449,885, 4,553,069, 4,681,213, 4,752,180, 4,773,687, 5,011,594, 5,046,909, 5,054,834, 5,547,515, 5,555,634, 5,692,873, 5,647,626, 5,765,890, 6,077,026, 6,086,976, 6,112,735, 6,116,848, 6,120,360, and 6,283,701, the disclosures of which are hereby incorporated herein by reference in their entirety. These devices hold wafers by various methods including mechanical clamping, vacuum pressure, electrostatic attraction, adhesives, chucks, and carrying trays.

Several drawbacks with current wafer holding techniques exist. For example, multiple moving parts have inherent reliability problems and are prone to failure. Additionally, vacuum pressure, clamping, and electrostatic devices typically require complex operating systems. Also, vacuum pressure, clamping and adhesives can damage wafer surfaces.

Certain devices exist for flexibly gripping items of various shapes; however, most are not suitable for handling semiconductor wafers. Examples of such devices can be found in U.S. Pat. Nos. 4,540,034, 4,839,947, and 5,121,908, the disclosures of which are hereby incorporated herein by reference in their entirety.

SUMMARY OF THE INVENTION

The invention relates to an apparatus for handling semiconductor wafers wherein the apparatus has a minimal number of moving parts. The invention is particularly useful in the handling of semiconductor wafers of varying diameters. Further, the apparatus handles wafers in a manner that substantially reduces or eliminates the likelihood of wafer damage. In addition, the apparatus can handle wafers by gripping the edges of the wafers, thereby eliminating the need for a carrier.

In one aspect, the invention includes a robotic end effector that includes at least one arm, a flexure joint, and a force element. In various embodiments, the force element can be an electric solenoid device, a pneumatic actuator, a piezoelectric actuator, or similar devices as known to those skilled in the art. In other embodiments, the end effector includes a second arm. One or both arms can be arcuate. The arms can be approximately the same length and the arms can include fingers for contacting the edges of a wafer. Furthermore, the apparatus need not be mounted on a robotic arm.

In another aspect, the invention relates to methods of handling wafers. One method includes the steps of moving an end effector into contact with a wafer, applying a force to the end effector, and removing the force on the end effector. Applying a force to the end effector causes at least one arm of the end effector to open by rotating away from the wafer. Once the end effector has fully grasped the wafer, the opening force is effectively removed. In one embodiment, the method includes the step of actuating a force element to open the flexure joint and release the wafer.

These and other objects, along with advantages and features of the present invention herein disclosed, will become apparent through reference to the following description, the accompanying drawings, and the claims. For example, the invention is scaleable and practical for use in handling materials other than semiconductor wafers. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION

Embodiments of the present invention are described below. It is, however, expressly noted that the present invention is not limited to these embodiments, but rather the intention is that all equivalents and all modifications that are apparent to a person skilled in the art are also included. In particular, the present invention is not intended to be limited to apparatus for handling semiconductor wafers.

Figure 1A:
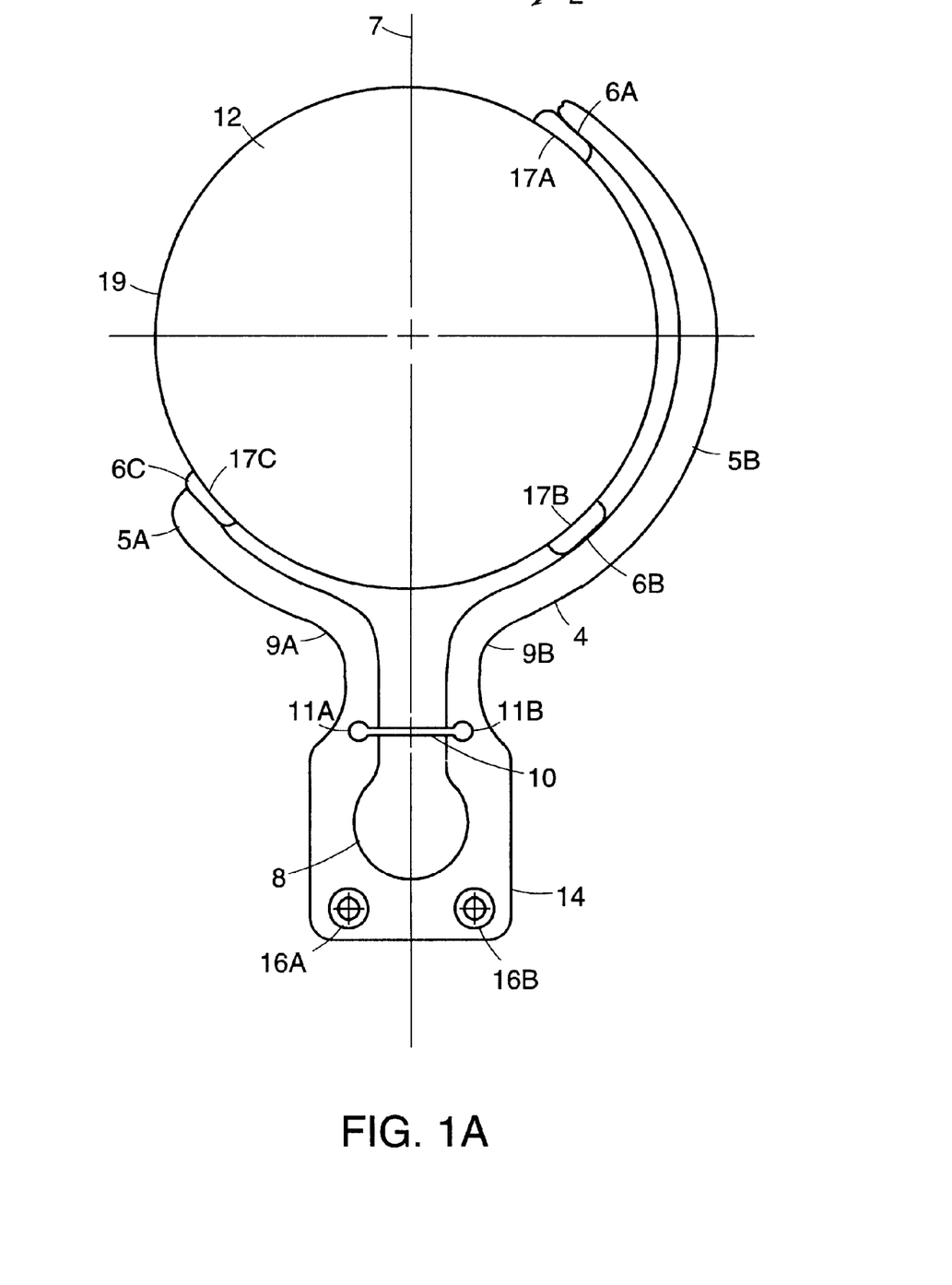
FIG. 1A is a schematic representation of one embodiment of an apparatus in accordance with the invention.
Figure 1B:
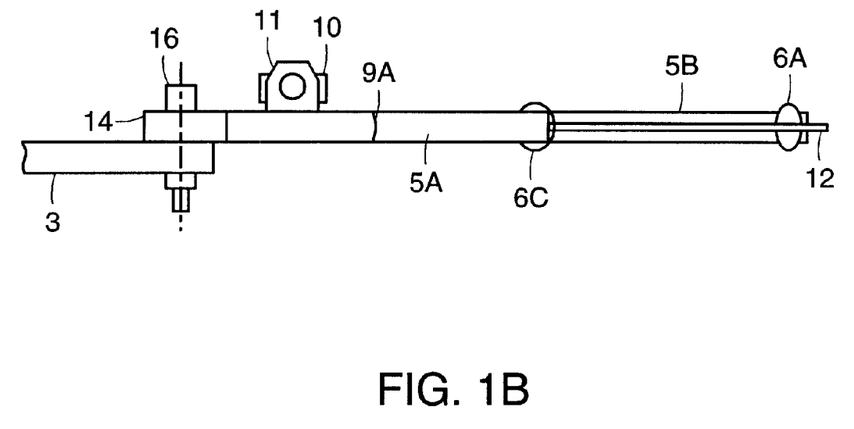
FIG. 1B is a schematic left side view of the apparatus of FIG. 1A.

One embodiment of the present invention is illustrated in FIGS. 1A and 1B. The apparatus 2 includes an end effector or gripping element 4, a flexure joint 8, and a force element 10. The end effector 4 includes two arms 5A, 5B that contact a wafer 12 about its peripheral edge 19. The contact area 17 could be continuous, but it is generally preferable to limit the contact area to three contact points 17A, 17B, 17C. The arms 5A, 5B can optionally include fingers 6A, 6B, 6C for contacting the wafer's peripheral edge 19.

The fingers 6A, 6B, 6C are preferably formed of a hard, wear-resistant material to minimize friction between the fingers 6A, 6B, 6C and the wafer 12, thereby reducing particle generation. Although, depending on the specific application, the fingers 6A, 6B, 6C can be any non-reactive material compatible with the item to be handled and suitable for use in various processing environments, for example, ceramic, rubber, or other dimensionally stable materials. In addition, the fingers 6A, 6B, 6C may include a flexible component to absorb shock from the force of the arms 5A, 5B as they grip the wafer 12. Typically, the fingers 6A, 6B, 6C are solid pieces rigidly coupled to the arms 5A, 5B; however, the fingers 6A, 6B, 6C could be rollers movably secured to the arms 5A, 5B.

The arms 5A, 5B are generally arcuate in shape, with the second arm 5B oriented to oppose the first arm 5A. The end effector 4 can be a single molded piece that includes the two arms 5A, 5B, a base 14, and the flexure joint 8. The end effector 2 can be manufactured out of natural or synthetic rubber or a resilient polymer resin so as to be compliant. Furthermore, the apparatus 2 can be mounted to a robotic arm 3. Mounting can be done through any means known to those of skill in the art, for example by chemical bonding or mechanical means. The apparatus 2 shown in FIGS. 1A and 1B includes mounting hardware 16A, 16B on the base 14 for interfacing with the robotic arm 3.

The flexure joint 8 acts as a hinge to allow the arms 5A, 5B to rotate away from a longitudinal axis 7 that bisects the wafer 12 once grasped. Essentially, the arms 5A, 5B open and close by means of a flexure. In the embodiment shown in FIGS. 1A and 1B, the flexure joint 8 is incorporated into the end effector 4. Essentially, the flexure joint 8 is created by removing sufficient material from the intersections of the arms 5A, 5B with the base 14 to permit the arms 5A, 5B to pivot and rotate away from the longitudinal axis 7 in response to a predetermined force applied to the arms 5A, 5B.

The force element 10 shown in FIGS. 1A and 1B is coupled to arms 5A, 5B at points 11A, 11B. The force element 10 can be coupled by a variety of methods, such as bonding or threaded fasteners. Optionally, the force element 10 is rotatably or pivotally coupled at point 11A or 11B or both. Typical useful force elements include an electric solenoid, a pneumatic actuator, and an piezoelectric actuator. The force element 10 is used to release the wafer 12 by opening the arms 5A, 5B. For example, actuating the force element 10 applies an outward force on the arms 5A, 5B, thereby opening the flexure joint 8 and releasing the wafer 12.

Figure 2A:
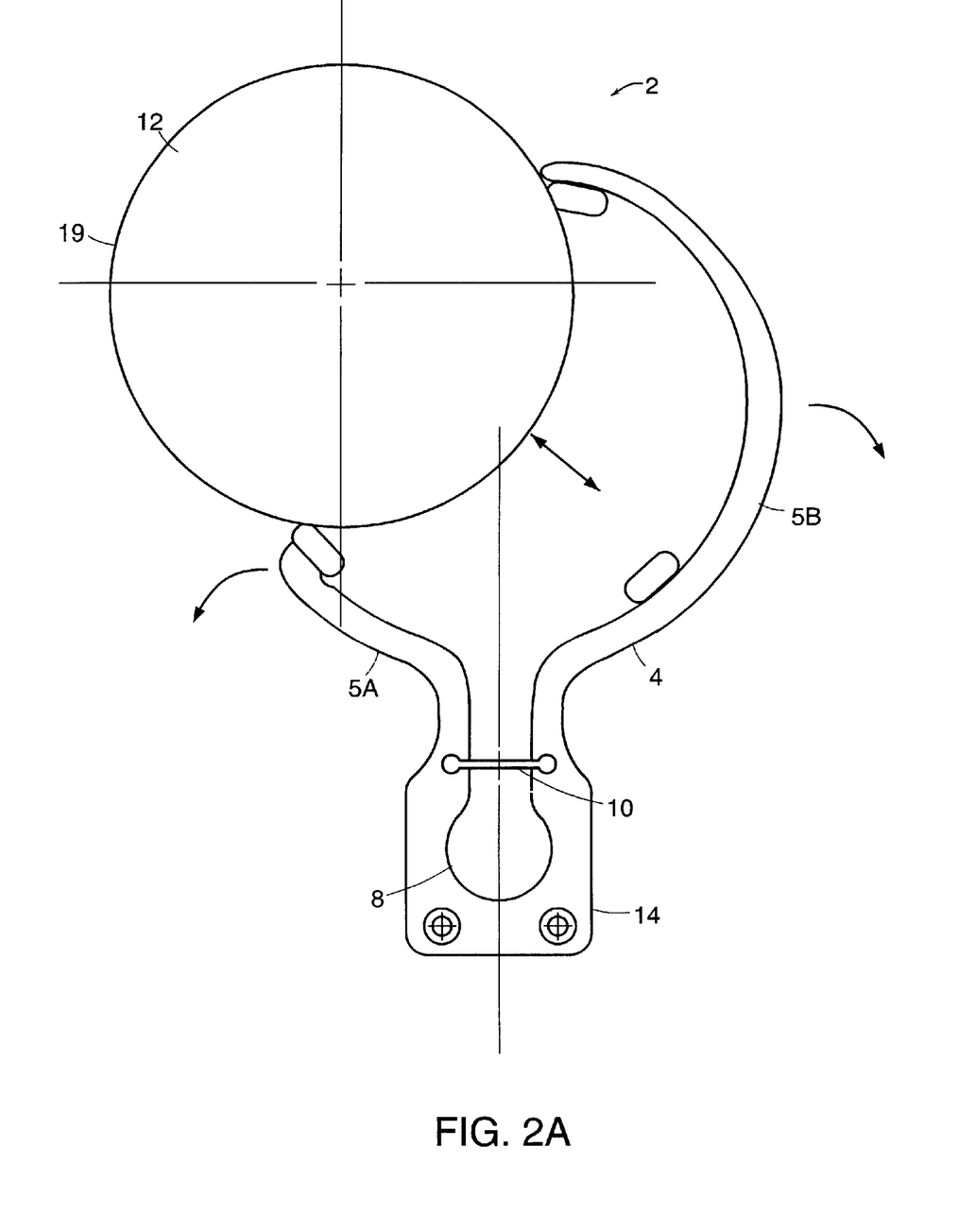
FIGS. 2A–2C are schematic representations of the apparatus of FIG. 1A in various operating positions.
Figure 2B:
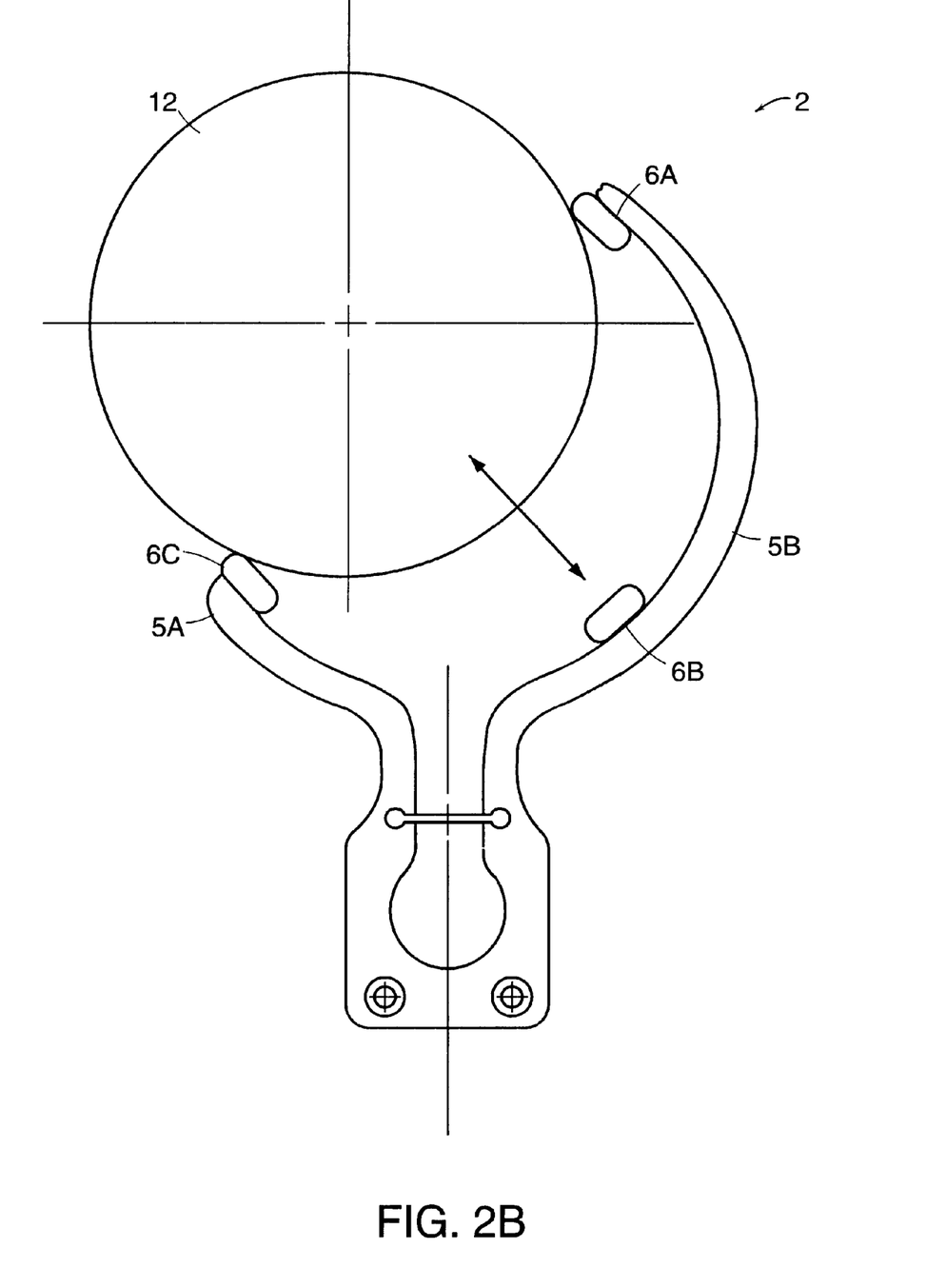
Figure 2C:
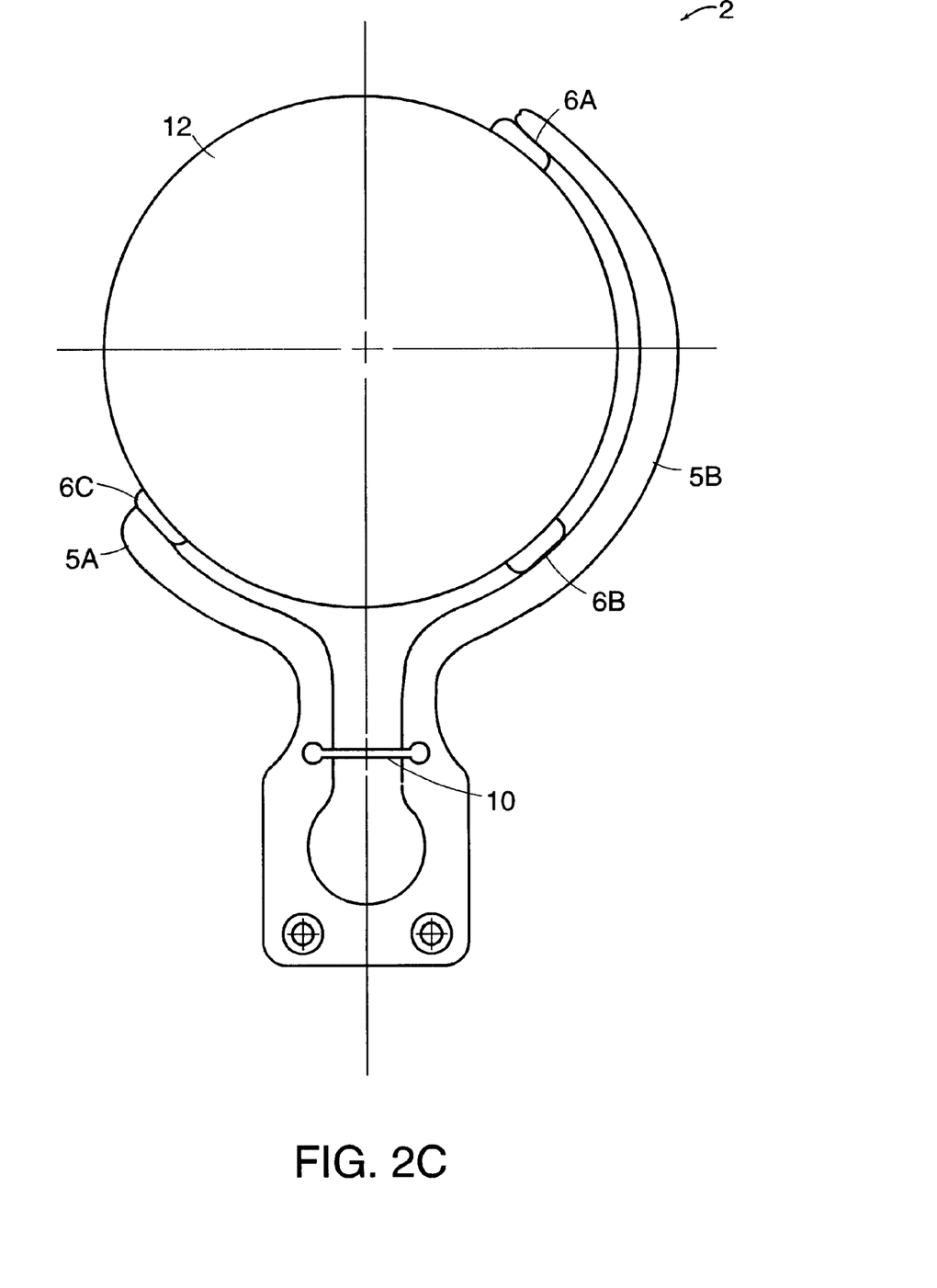

More specifically, FIGS. 2A–2C depict the operation of the apparatus 2 at three different stages. As shown in FIG. 2A, the apparatus 2 is moved towards the wafer 12 such that the end effector 4 contacts the wafer's peripheral edge 19. The apparatus can be moved by a robotic arm or manually. Movement of the apparatus 2 continues in the direction of the wafer 12 such that a contact force is applied to the arms 5A, 5B. In response thereto, the arms 5A, 5B rotate outwardly from each other at the flexure joint 8.

FIG. 2B depicts the apparatus 2 in an intermediate stage. As can be seen, the arms 5A, 5B have opened up to accept the wafer 12. Force continues to be applied to the arms 5A, 5B until the arms 5A, 5B fully envelop and grasp the wafer 12. At this point, all the fingers 6A, 6B, 6C are in contact with the peripheral edge 19 of the wafer 12, as shown in FIG. 2C. As can be seen, the wafer 12 is securely gripped by the apparatus. The force element 10 is used to release the wafer 12. The force element 10 forces open the arms 5A, 5B, thereby releasing the wafer 12.

Figure 3:
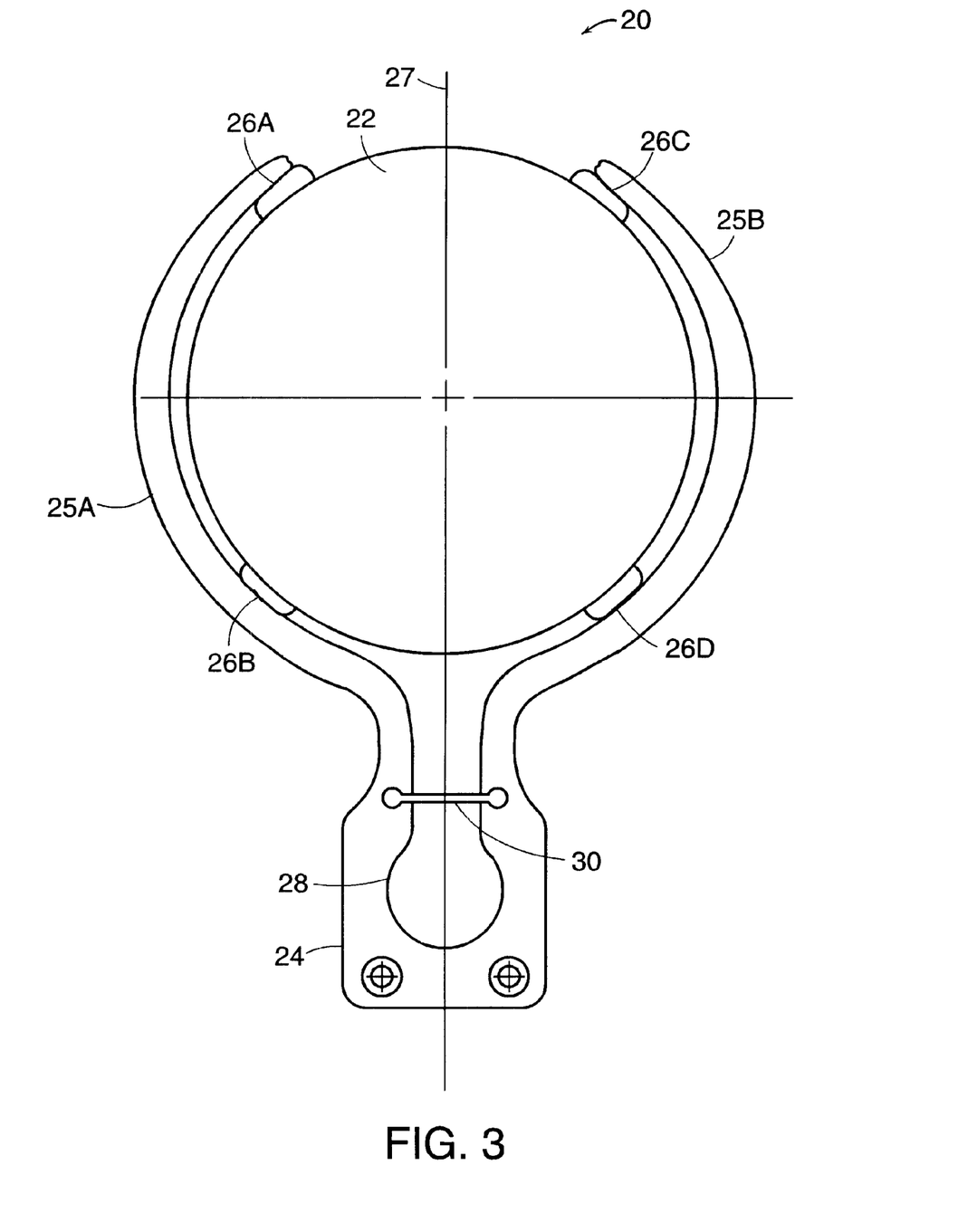
FIG. 3 is a schematic representation of an alternative embodiment of an apparatus in accordance with the invention.

FIG. 3 depicts an alternative embodiment of the apparatus shown in FIG. 1. The apparatus 20 is another one-piece construction apparatus 20 including an end effector 24 with arms 25A, 25B of equal length. Each arm 25A, 25B includes two fingers 26A, 26B, 26C, 26D for contacting the wafer 22.

The arms 25A, 25B flex in response to an applied contact force. The arms 25A, 25B rotate outwardly from longitudinal axis 27 and about the flexure joint 28.

Figure 4:
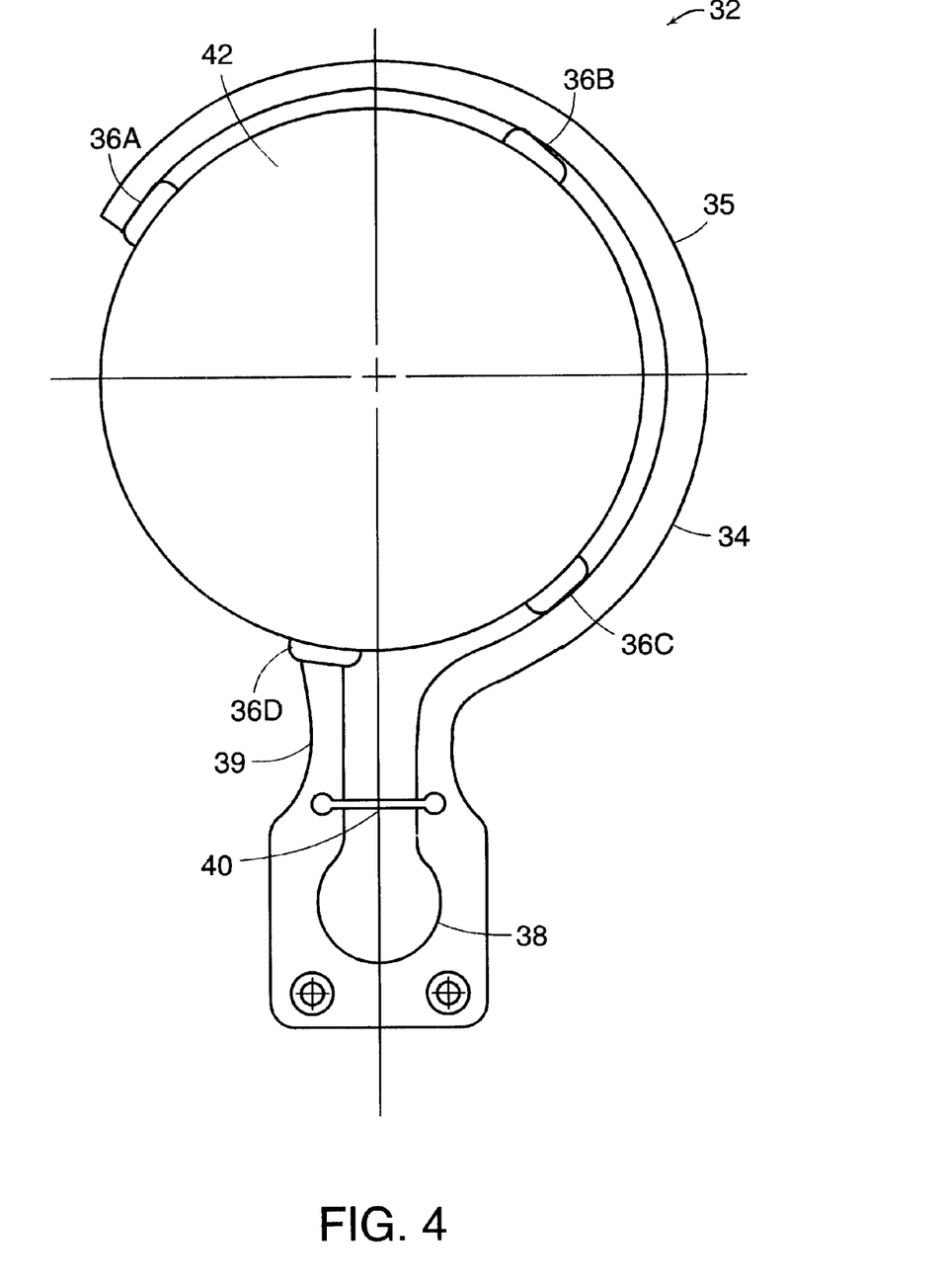
FIG. 4 is a schematic representation of another alternative embodiment of an apparatus in accordance with the invention.

In the embodiment of the apparatus 32 shown in FIG. 4, the end effector 34 has a single, arcuate arm 35. The angular sweep of the arm 35 can range from about 180 degrees to about 330 degrees, preferably about 210 degrees to 300 degrees, and more preferably about 240 degrees to about 270 degrees. The arm 35 includes three fingers 36A, 36B, 36C, which are preferably, approximately equally space about the arm 35. The apparatus 32 optionally includes a stop 39 that assists in the alignment of the wafer 42. The optional stop 39 may include a finger 36D for contacting the wafer 42.

The material, thickness, and geometry of an end effector in accordance with the invention is selected to provide sufficient compliancy to the apparatus, such that the contact force required to open the arm(s) to receive the wafer is not excessive and the resulting clamping force when the wafer is captured and seated is sufficient to prevent the wafer from being dropped as it is accelerated and decelerated during transport in the wafer processing apparatus.

Having described certain embodiments of the invention, it will be apparent to those of ordinary skill in the art that other embodiments incorporating the concepts disclosed herein can be used without departing from the spirit and the scope of the invention. For example, the end effector need not be manufactured as a single piece, but could be two or more pieces bonded together or mechanically assembled. Accordingly, the described embodiments are to be considered in all respects only as illustrative and not restrictive. Therefore, it is intended that the scope of the present invention be only limited by the following claims.

What is claimed is:

1. An apparatus for handling wafers, comprising:
   an end effector including at least one arm;
   a unitary flexure joint; and
   a force element, wherein said end effector is forced open by contact with a wafer.

2. The apparatus of claim 1, wherein the force element is an electric solenoid device.

3. The apparatus of claim 1, wherein the force element is a pneumatic actuator.

4. The apparatus of claim 1, wherein the force element is a piezoelectric actuator.

5. The apparatus of claim 1, wherein the at least one arm includes at least two fingers.

6. The apparatus of claim 1, wherein the at least one arm is arcuate.

7. The apparatus of claim 1, wherein the end effector includes a second arm.

8. The apparatus of claim 7, wherein the second arm is arcuate.

9. The apparatus of claim 8, wherein the second arm includes at least one finger.

10. The apparatus of claim 8, wherein the arms are of approximately the same length.

11. A method of handling wafers comprising the steps of:
    moving an end effector into contact with a wafer; and
    applying a force to the end effector, thereby causing a unitary flexure joint to flex and at least one arm of the end effector to rotate outwardly, and wherein the applied force moves the end effector around the wafer.

12. The method of claim 11, further comprising the step of actuating a force element to open the flexure joint and release the wafer.

* * * * *